(12) United States Patent
Huang et al.

(10) Patent No.: US 7,141,460 B2
(45) Date of Patent: Nov. 28, 2006

(54) METHOD OF FORMING TRENCHES IN A SUBSTRATE BY ETCHING AND TRIMMING BOTH HARD MASK AND A PHOTOSENSITIVE LAYERS

(75) Inventors: Ming-Jie Huang, Hsin-chu (TW); Hun-Jan Tao, Hsin-chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 175 days.

(21) Appl. No.: 10/899,927

(22) Filed: Jul. 27, 2004

(65) Prior Publication Data

US 2004/0266134 A1    Dec. 30, 2004

Related U.S. Application Data

(62) Division of application No. 10/284,963, filed on Oct. 31, 2002, now Pat. No. 6,794,230.

(51) Int. Cl.
   - *H01L 21/00* (2006.01)
   - *H01L 21/84* (2006.01)
   - *H01L 21/3205* (2006.01)
   - *H01L 21/4763* (2006.01)
   - *H01L 21/302* (2006.01)

(52) U.S. Cl. ............ 438/154; 438/587; 438/706; 438/740; 438/744

(58) Field of Classification Search ......... 438/154, 438/587, 706, 740, 744
See application file for complete search history.

(56) References Cited

U.S. PATENT DOCUMENTS

| 6,121,155 | A | 9/2000 | Yang et al. |
|---|---|---|---|
| 6,197,687 | B1 | 3/2001 | Buynoski |
| 6,204,133 | B1 | 3/2001 | Yu et al. |
| 6,283,131 | B1 | 9/2001 | Chen et al. |
| 6,420,097 | B1 * | 7/2002 | Pike et al. ............ 430/313 |
| 6,482,726 | B1 | 11/2002 | Aminpur et al. |
| 6,566,230 | B1 * | 5/2003 | Sachar et al. ......... 438/435 |
| 2002/0081854 | A1 | 6/2002 | Morrow et al. |

OTHER PUBLICATIONS

Stanley Wolf Ph.D. and Richard N. Tauber Ph.D. in Silicon Processing for the VLSI Era, vol. 1: Process Technology, Lattice Press, 1986, pp. 546-551, 581-582.*

Stanley Wolf Ph.D. and Richard N. Tauber Ph.D., "Silicon Processing for the VLSI Era", vol. 1: Process Technology, Lattice Press, 1986, pp. 439-441.

* cited by examiner

*Primary Examiner*—William M. Brewster
(74) *Attorney, Agent, or Firm*—Haynes and Boone, LLP

(57) ABSTRACT

A process is described for transferring a photoresist pattern into a substrate. In one embodiment a stack comprised of a top photoresist layer, a middle ARC layer, and a bottom hardmask is formed over a gate electrode layer. A line in the photoresist pattern is anisotropically transferred through the ARC and hardmask. Then an isotropic etch to trim the linewidth by 0 to 50 nm per edge is performed simultaneously on the photoresist, ARC and hardmask. This method minimizes the amount of line end shortening to less than three times the dimension trimmed from one line edge. Since a majority of the photoresist layer is retained, the starting photoresist thickness can be reduced by 1000 Angstroms or more to increase process window. The pattern is then etched through the underlying layer to form a gate electrode. The method can also be used to form STI features in a substrate.

15 Claims, 9 Drawing Sheets

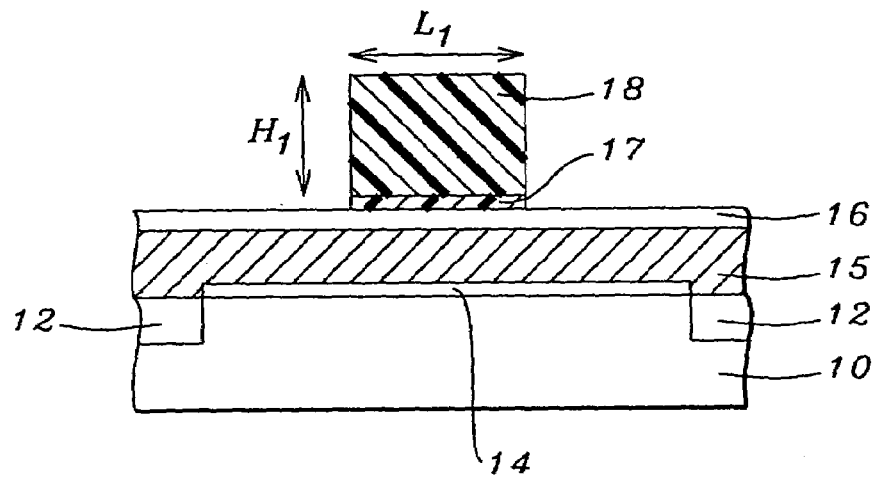
FIG. 1a – Prior Art
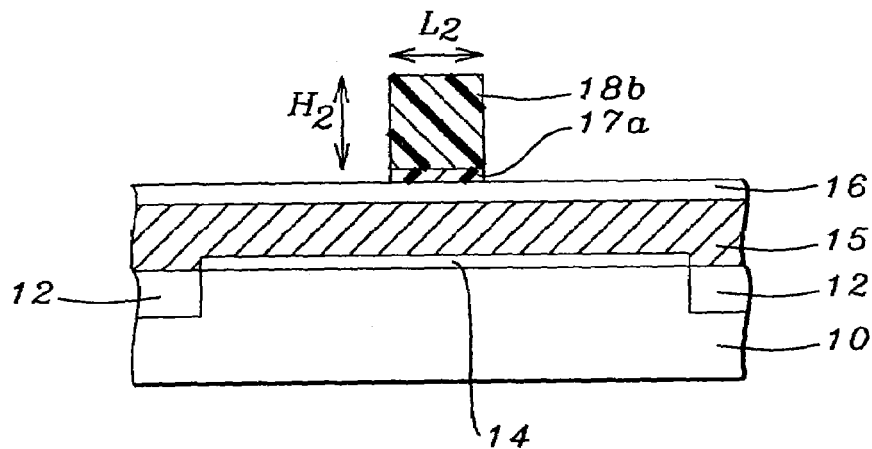
FIG. 1b – Prior Art
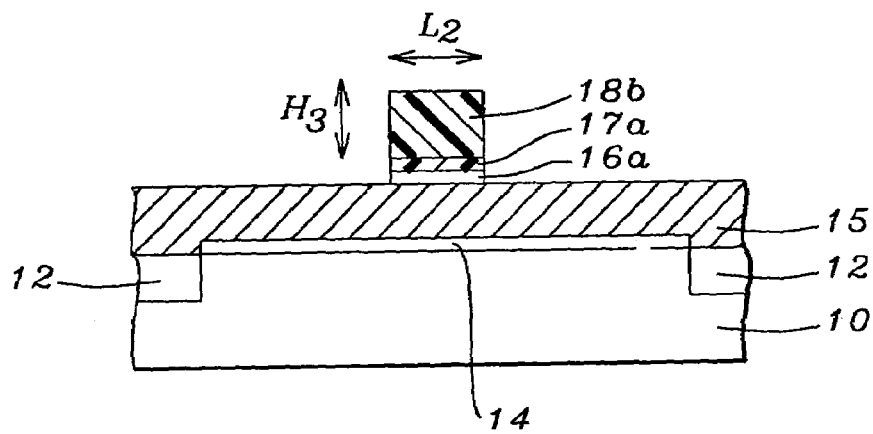
FIG. 1c – Prior Art

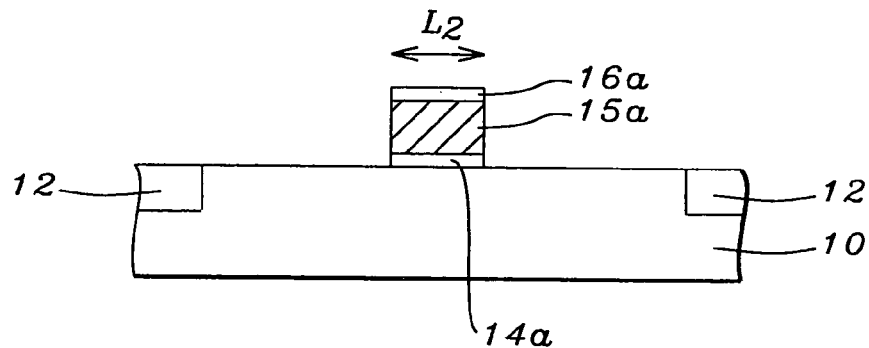
FIG. 1d – Prior Art
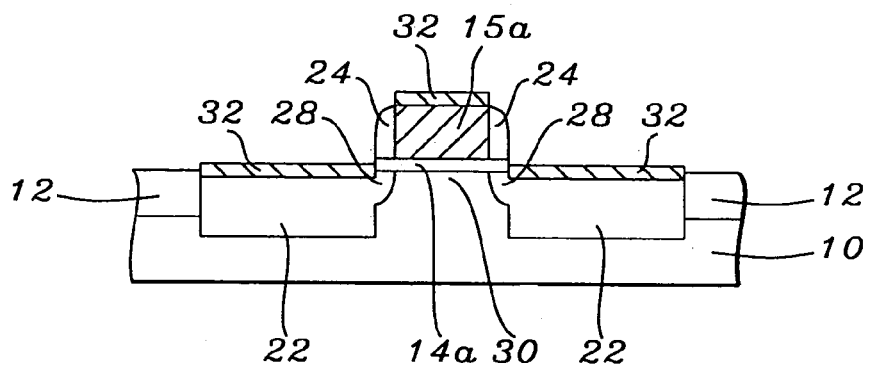
FIG. 1e – Prior Art
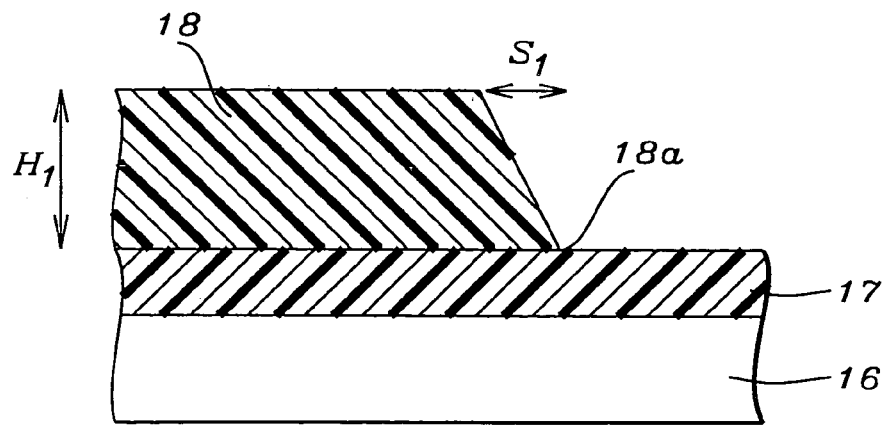
FIG. 2a – Prior Art

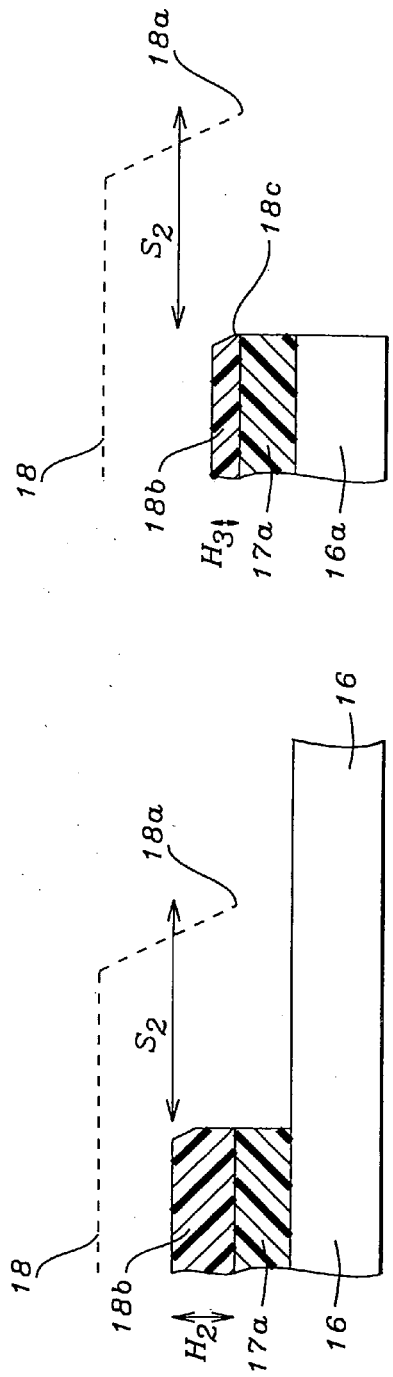
FIG. 2b – Prior Art
FIG. 2c – Prior Art
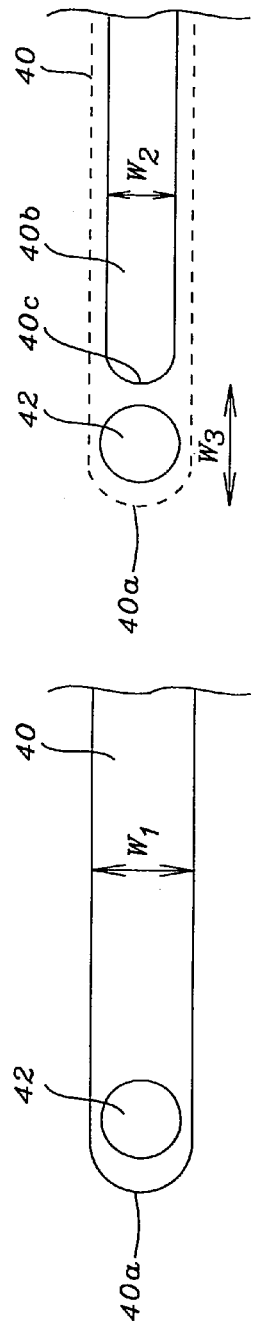
FIG. 3a – Prior Art
FIG. 3b – Prior Art

US 7,141,460 B2

METHOD OF FORMING TRENCHES IN A SUBSTRATE BY ETCHING AND TRIMMING BOTH HARD MASK AND A PHOTOSENSITIVE LAYERS

DOMESTIC PRIORITY CLAIM

This application is a divisional of U.S. patent application Ser. No. 10/284,963 filed Oct. 31, 2002, now U.S. Pat. No. 6,794,230, and entitled, "Novel Approach to Improve Line End Shortening," which is hereby incorporated by reference in its entirety.

FIELD OF THE INVENTION

The invention relates to a method of fabricating semiconductor structures, and more particularly, to etch transferring a photoresist pattern into a substrate during the formation of an integrated circuit.

BACKGROUND OF THE INVENTION

There is a constant demand to improve the performance of a Metal-oxide-semiconductor field effect transistor (MOSFET) which typically involves faster speeds and higher reliability. The speed of the device is usually governed by the width of the gate electrode that is also referred to as the gate length and which is typically one of the smallest dimensions in the device. The critical dimension (CD) or gate length is being reduced in each successive technology generation. The 130 nm technology node has gate lengths from about 100 nm to about 130 nm. For the 100 nm node that is currently being implemented in manufacturing, gate lengths as small as 60 or 70 nm are being produced. One shortcoming in state of the art lithography processes is that they are incapable of controllably printing features in photoresist smaller than about 100 nm. Many semiconductor manufacturers have overcome this problem using a trimming process which laterally shrinks the photoresist line with an etch step.

MOSFETs are typically made by first defining active areas in a substrate 10 by forming isolation regions 12 consisting of insulating material like silicon dioxide as shown in FIG. 1a. Isolation regions can be generated by local oxidation of silicon (LOCOS) or by a shallow trench isolation (STI) technique that was used to form isolation regions 12 depicted in the drawing. A thin gate oxide layer 14 is grown over the substrate between the isolation regions 12 and then a gate electrode material 15 such as polysilicon is deposited on the gate oxide. Next a hardmask 16 is deposited on gate electrode layer 15. Optionally, an anti-reflective coating (ARC) 17 is coated on the hardmask 16 in order to improve process latitude during a subsequent photoresist patterning step. A photoresist is spin coated to provide a photoresist layer 18 and is patterned using conventional methods to form a line having a width L1 in FIG. 1a. Photoresist 18 then serves as an etch mask for etching the pattern through ARC 17.

Frequently, L1 is not narrow enough to meet the requirements for a fast transistor speed. Therefore, prior art methods usually include a resist trimming step in which a plasma etch is used to laterally shrink dimension L1 to a smaller size L2 shown in FIG. 1b. The height H1 of photoresist layer 18 decreases to a thickness H2 in the etched photoresist film 18b. Linewidth L2 is transferred into hardmask 16 to give an etched hardmask layer 16a shown in FIG. 1c.

Referring to FIG. 1d, photoresist 18b and ARC 17a are stripped and linewidth L2 in hardmask 16a is etch transferred through polysilicon 15 and oxide layer 14 to form layers 14a, 15a. Additional processing to fabricate the MOSFET includes forming spacers 24 on the sides of etched polysilicon layer 15a, forming source/drain regions 22 and source/drain extensions 28 to define a channel 30, and forming silicide contact regions 32 as illustrated in FIG. 1e.

One problem associated with trimming photoresist 18 is that shortening occurs at line ends which can degrade device performance. A cross sectional view in FIG. 2a is of a line end from an angle perpendicular to a long side of the line. Because of imperfections in the lithography process to form photoresist line 18, the line is tapered near the end represented by 18a. There is a region with length S1 near line end 18a where the thickness is less than H1. During the photoresist trimming step that shrinks L1 to L2 and H1 to H2 in FIG. 1b, the region having length S1 near line end 18a does not offer as much resistance to the etch as the remainder of line 18 and therefore the line 18 is shortened by a distance S2 as depicted in FIG. 2b. Although the specification is for line end shortening (LES) to be less than three times the distance (L1−L2/2) trimmed from one long side of the line 18b, LES or S2 is often as large as 7 times the trimmed amount, especially for linewidths L1 that are sub-200 nm in size.

Furthermore, the height H2 in FIG. 1b is considerably shorter than the original thickness H1 in line 18 and may not be a good etch mask for pattern transfer into hardmask 16. In some cases as shown in FIG. 2c, only 10 nm or less of photoresist height H3 remains after the hardmask 16 etch. As a result, rough edges at the top of line 18b in FIG. 2b can easily generate grooves in the sidewalls of line 18 that are transferred through ARC 17a into hardmask 16a which is detrimental to device performance. Generally, a 50 to 100 nm thickness H3 in photoresist 18b is desirable in FIG. 1c but for prior art methods this might require coating a thicker photoresist 18 that could dramatically reduce process latitude for forming line 18 in FIGS. 1a and 2a. Therefore, an improved method is needed that enables a larger H2 and H3 and simultaneously reduces the amount of LES (S2).

The top down view in FIG. 3a shows another problem associated with LES. The design in this example which might occur in an SRAM cell calls for a pattern in photoresist line 40 having a width $W_1$ and a line end 40a to be transferred into an underlying polysilicon layer (not shown) that overlaps a contact 42. Because of line end shortening during an etch to trim photoresist line 40 to line 40b having a width $W_2$ and a line end 40c as illustrated in FIG. 3b, line 40b does not overlap contact 42 and an "open" circuit defect is produced after a subsequent etch transfer into the polysilicon layer. Note that the LES distance $W_3$ which is the difference between line end 40a and line end 40c is significantly longer than the dimension ($W_1-W_2/2$) that was trimmed from one side of the line 40 to form line 40b. In some cases, mask designers might be able to intentionally add extensions to the line on the mask that will print a longer photoresist line 40. However, in most instances, this correction is not possible because there is not enough room in the mask design to compensate for LES.

Prior art patents offer improvements for trimming photoresist patterns to provide a smaller gate length than can be generated by lithography methods. U.S. Pat. No. 6,121,155 describes a trim etch process whereby a critical dimension (CD) loss saturation point is reached that limits further lateral loss in a photoresist line.

In. U.S. Pat. No. 6,197,687, a photoactive layer is coated above a photoresist layer and both are patterned to provide a gate length that is reduced by a trim etch involving HBr, oxygen, and argon. Since the photoactive layer has an etch rate equal to or less than the photoresist layer, the entire height of the photoresist is retained during the trim etch.

In U.S. Pat. No. 6,283,131, a trim etch, a hardmask etch, a photoresist strip, a cleaning operation, and a gate etch are all performed in the same etch chamber to reduce wafer handling and decrease cycle time. In this case, when a photoresist trimming is required, the trim occurs before etching the hardmask layer. The trim etch employs a gas mixture including HBr, $O_2$, and Ar while the etch through the oxynitride hardmask uses $CF_4$ and Ar.

U.S. Pat. No. 6,204,133 describes a reduced gate length in which spacers are formed on the walls of an opening in a phosphosilicate glass (PPG) layer that has been deposited on a substrate. The spacers are formed by an anisotropic etch of a conformal dielectric layer. A heat treatment diffuses ions from the PPG into the substrate to form lightly doped source/drain regions. Oxide and polysilicon layers are then deposited and patterned by conventional means to form a gate electrode. Although LES is an important issue in fabricating integrated circuits, there is no prior art that mentions how to minimize the problem through a controllable etch process. A workable method should be readily implemented in manufacturing and should be versatile so that it can be applied to the manufacture of a variety of features including trenches, lines, islands and elongated holes.

SUMMARY OF INVENTION

One objective of the present invention is to provide a means of reducing the linewidth of a photoresist pattern while simultaneously minmizing the line end shortening that occurs during the same trimming etch step.

A further objective of the present invention is to provide a method of transferring a pattern into a substrate with a reduced amount of line end shortening.

A still further objective of the present invention is to provide a photoresist trimming process and etch transfer method that retain a majority of the original photoresist film thickness to prevent rough edges on photoresist features from being transferred into a substrate. Alternatively, if photoresist thickness loss is not a primary concern, then the method should enable a thinner photoresist film to be employed that affords a larger process window for the patterning process.

These objectives are achieved in one embodiment whereby a novel etch method is used to form a polysilicon gate electrode. A substrate is provided upon which a gate dielectric layer comprised of a nitride, oxide, or silicon carbide is formed. A polysilicon layer is deposited on the gate dielectric layer and then a hardmask such as silicon nitride or silicon oxynitride is deposited. Optionally, an anti-reflective coating (ARC) may be coated on the hardmask to provide a larger process window during a subsequent lithography step. Then a photoresist is coated and patterned to form a line with a lateral dimension that must be further reduced by an etch trimming step.

In the first etch step, the pattern is anisotropically transferred through the ARC and through the hardmask with a plasma etch involving $CF_4$ and Ar. There is a small amount of line end shortening. Next, a lateral trim or isotropic etch is accomplished on the photoresist, ARC, and hardmask simultaneously by using an etch chemistry comprised of $C_XF_Y$, $H_2$, and optionally $O_2$. The method provides a significant decrease in the amount of line end shortening during the trim process and also retains a larger amount of photoresist thickness compared to conventional methods in which the photoresist is trimmed followed by pattern transfer through a hardmask.

The photoresist and ARC are removed and the hardmask serves as an etch mask for transferring the pattern through the underlying polysilicon and oxide layers. Conventional processes then follow to form spacers on the sides of the polysilicon gate electrode, to form source/drain regions in the substrate and to produce metal silicide contacts in the MOSFET manufacturing scheme.

In a second embodiment, the method of the present invention is applied to the formation of an STI feature. A silicon nitride layer is formed on a substrate and then a hardmask such as silicon oxynitride is deposited on the nitride. Optionally, an organic or inorganic ARC is deposited on the hardmask to improve process latitude in a later photoresist patterning step. A photoresist layer is coated and patterned to form trench openings. First, an anisotropic etch is performed to transfer the pattern through the hardmask. Then the photoresist and hardmask are simultaneously etched isotropically to shrink the linewidth between trench openings with a plasma etch involving $C_XF_Y$, $H_2$, and optionally $O_2$. The shrinkage in the active area between the trenches is better controlled than in conventional processes that require a photoresist trim prior to etch transfer through the hardmask. Likewise, the ends of the trenches are kept within specification by restricting lateral growth during the etch transfer. The photoresist is stripped and the pattern is etch transferred through the nitride and into the substrate to form shallow trenches which are then filled with a dielectric material such as $SiO_2$.

BRIEF DESCRIPTION OF THE DRAWINGS

FIGS. 1a–1e depict a prior art process for trimming a photoresist line to provide a small gate length in a MOSFET device.

FIGS. 2a–2c are cross-sectional views demonstrating line end shortening during etch transfer according to the method illustrated in FIGS. 1a–1e.

FIGS. 3a–3b are top down views of line end shortening in a prior art method of trimming a photoresist line.

DETAILED DESCRIPTION OF THE INVENTION

The present invention has been found to decrease the amount of line end shortening (LES) during a plasma etch transfer of a pattern into a substrate when forming gate electrodes in a MOSFET for semiconductor or MEMS devices. The method is not limited to isolated or semi-isolated line features but can also apply to dense lines, contact holes and trenches. The invention is not limited to the specific examples described in the embodiments or shown in the figures which are not necessarily drawn to scale. The pattern is initially formed in a photosensitive layer that is typically an organic photoresist but could conceivably be an inorganic material.

Figure 4A:
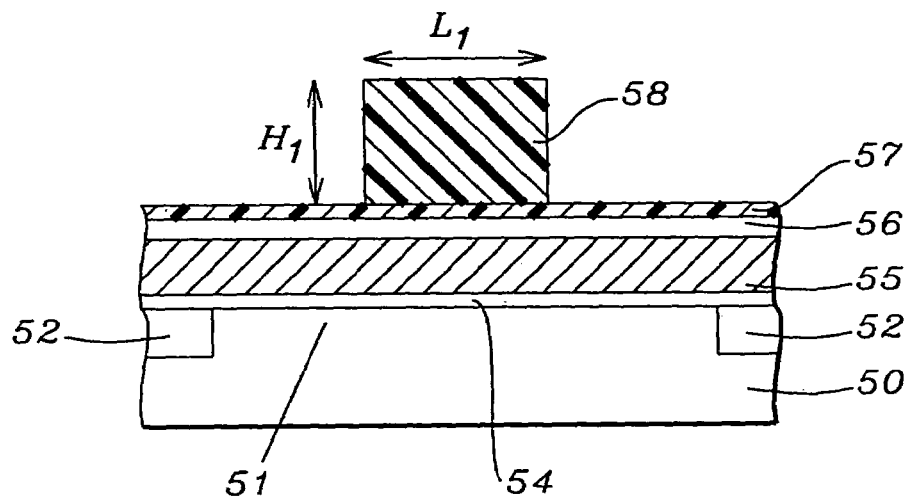
FIGS. 4a–4d show a method of trimming a photoresist line according to an embodiment of the present invention.

The first embodiment is illustrated in FIGS. 4a–4d. Referring to FIG. 4a, a substrate 50 that is typically silicon with a field implant of an impurity such as boron is provided and has an active area 51 located between two isolation regions 52. Isolation regions can be formed by a LOCOS method or in this case, shallow trench isolation (STI) features 52 are depicted. The STI regions 52 are filled with an insulating material such as silicon dioxide or a low k dielectric material. A gate dielectric layer 54 is formed on substrate 50 by a method such as chemical vapor deposition (CVD) and is comprised of silicon oxide, silicon nitride, or silicon carbide and has a thickness in the range of about 10 to 30 Angstroms. When gate dielectric layer 54 is silicon oxide, it may also be formed by placing substrate 50 in a thermal oxidation furnace with a dry oxygen ambient at approximately 600° C. to 800° C. Other methods such as RTO (rapid thermal oxidation) may also be used to grow an oxide layer. A polysilicon layer 55 from about 1000 Angstroms to 2000 Angstroms in thickness is deposited on dielectric layer 54 with a CVD method. Polysilicon layer 55 may be doped or undoped.

A hardmask 56 comprised of silicon nitride or silicon oxynitride is then formed on polysilicon layer 55 and has a thickness from about 300 to 1000 Angstroms. Optionally, an organic or inorganic ARC 57 is deposited on hardmask 56 to improve the process latitude of a subsequent photoresist patterning process. When ARC 57 is an organic material that is available from several suppliers, the thickness is in the range of about 300 to 1000 Angstroms after the material is spin coated and cured at about 180° C. to about 230° C. A photoresist composition is then spin coated and patterned to form a photoresist line 58 having a height H1 of between about 1500 and 4000 Angstroms and a width L1. The photoresist composition is selected depending on the desired width L1. When L1 is sub-130 nm, a 193 nm or sub-200 nm exposing wavelength is preferred in order to print L1 and line 58 with a reasonable process latitude. For L1 values in the range of about 130 nm to about 300 nm, Deep UV radiation involving a 248 nm wavelength is generally preferred. It should be noted that an organic ARC 57 is chosen based on the exposing wavelength (□) since each ARC composition has a fixed refractive that is optimized for a particular □. In the case of an inorganic ARC 57 that is a composite material containing more than two elements and is deposited by a CVD method, the refractive index can be tuned for different exposing wavelengths.

Even though linewidth L1 for photoresist line 58 is the minimum size that can be printed with a particular lithography system including exposure tool, mask, photoresist and illumination conditions, L1 is often not small enough to meet the requirements for gate lengths that enable faster transistor speeds. Therefore, the linewidth that is transferred into the polysilicon layer 55 to form a gate electrode must be reduced to a dimension L2.

Figure 4B:
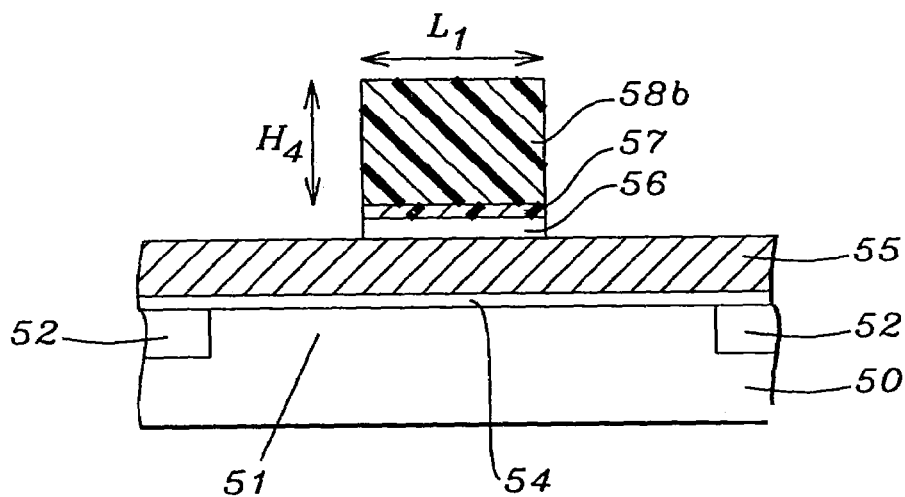

Referring to FIG. 4b, one key aspect of the present invention is that the pattern is first anisotropically transferred through ARC 57 and through hardmask 56 with a plasma etch. The etch is preferably performed with a $CF_4$ gas flow of 50 to 200 standard cubic centimeters per minute (sccm), an argon flow of 50 to 200 sccm, a chamber pressure of about 3 to 20 mTorr, a chamber temperature of about 50° C. to 70° C. and a RF power of between about 200 and 600 Watts. The etch is usually stopped at a point indicated by an end point signal when monitoring the plasma gas mixture. The original photoresist height H1 after patterning may be lowered slightly by the etch to H4 in photoresist line 58b but linewidth L1 remains constant. ARC 57 and hardmask 56 also have a linewidth L1.

Figure 4C:
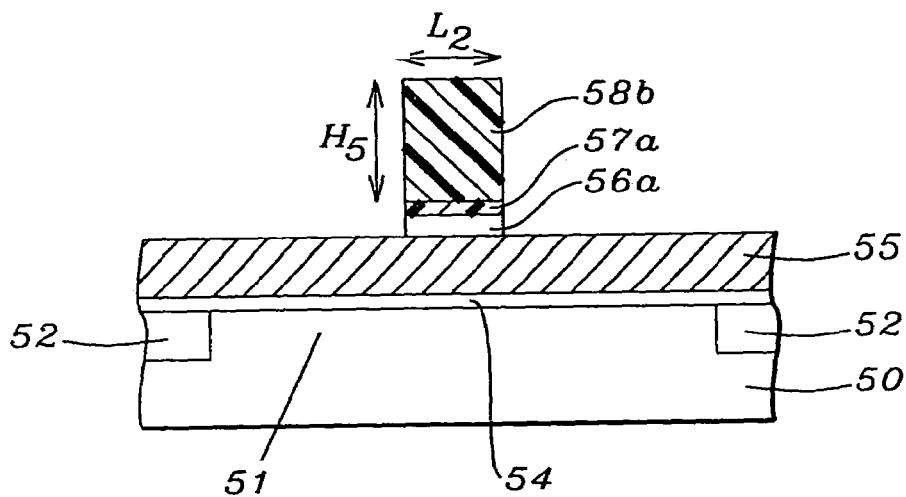

Referring to FIG. 4c, a second key aspect of this invention is that linewidth L1 is reduced to L2 by an isotropic etch that trims hardmask 56 simultaneously while laterally shrinking photoresist line 58b and ARC 57. Hardmask 56 trim etch is performed preferably with the following conditions: a 50 to 200 sccm flow rate of $C_XF_Y$ that is selected from a group including $CF_4$, $C_2F_6$, $C_3F_6$, $C_4F_6$, $C_4$, $F_8$, and $C_5F_8$; a 50 to 300 sccm flow rate of $H_2$; a chamber pressure of about 3 to 20 mTorr; a chamber temperature of about 50° C. to 70° C.; and a RF power of between 300 and 1000 Watts. Optionally, oxygen with a flow rate of from 5 to 50 sccm is added to the gas mixture. The trim etch may be performed in the same etch chamber as the previous pattern transfer etch.

The amount of reduction in line 58b, ARC 57, and hardmask 56 when L1 is sub-200 nm for current technologies is up to 50 nm per edge or as much as a 100 nm total reduction from L1 to L2 for line 58b, ARC 57a, and hardmask 56a. The height of line 58b is decreased somewhat during the etch to H5 from H4 but the top loss is less than what is realized during conventional photoresist trimming methods. The new gate length L2 has been achieved with a minimal amount of line end shortening as will become evident during a description of FIGS. 5a–5c.

Figure 5A:
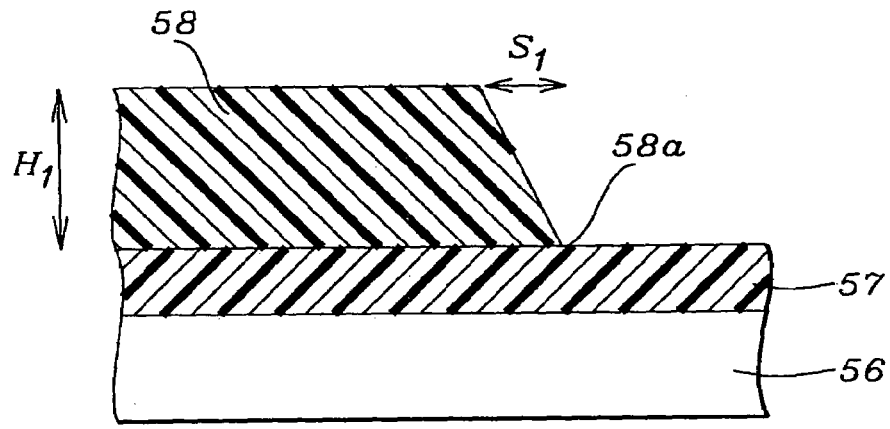
FIGS. 5a–5c are cross-sectional views demonstrating how line end shortening is minimized during pattern transfer and line trimming according to the present invention.
Figure 5B:
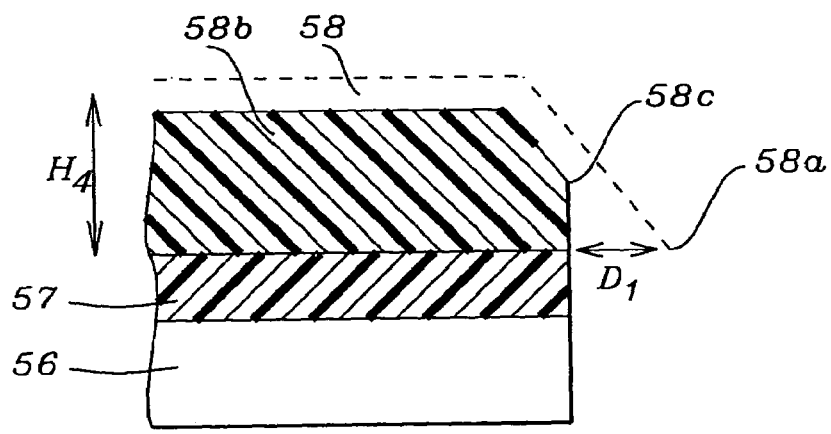
Figure 5C:
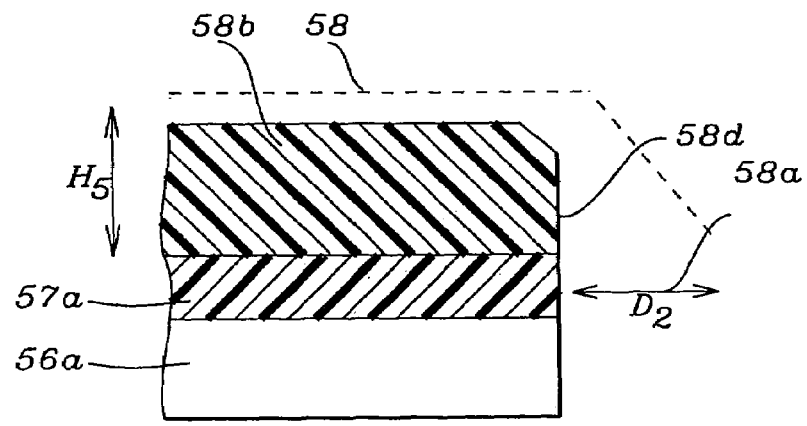

Another view that is important to understanding the method of decreasing LES during the pattern transfer and trimming steps is illustrated in FIGS. 5a–5c. The cross sectional view in FIG. 5a is perpendicular to a long side of line 58 and shows line end 58a. Because of imperfections in the lithography process, line 58 near line end 58a has a region with length S1 where the thickness is less than H1. During the anisotropic etch through ARC 57 and hardmask 56, line 58b is produced with a height H4 that is slightly less than H1 in FIG. 5a. Line 58b terminates at line end 58c and is shorter than line 58 by a dimension D1 as shown in FIG. 5b.

During the hardmask 56 trim etch depicted in FIG. 5c, the thickness of line 58b may be further reduced to a value H5. Line 58b now terminates at line end 58d and is shorter than line 58 by a dimension D2. In actual practice, when L1 is reduced by an amount of 50 nm per side, D2 is approximately 100 nm in size. This is a significant improvement over a prior art process shown in FIGS. 2a–2c where a reduction in L1 of 50 nm per side results in an S2 or LES of up to 350 nm. Another improvement of note is that starting with a H1 thickness of 250 run, photoresist retention as represented by H5 in FIG. 5c is about 150 run compared to only 10 nm as represented by H3 in the prior art method in FIG. 2c. In the present invention, L1 in FIG. 4a is reduced from 99 nm to an L2 in FIG. 4c of 62 nm.

The higher film retention provided by the process in the first embodiment is an advantage in one of two ways. Either the starting photoresist thickness during the patterning step can be reduced to enable a larger process window that is associated with thinner photosensitive films or the thickness can be maintained in the original photoresist coating to provide a thicker etch mask for the etch transfer and trim etch steps. As mentioned previously, a thicker photoresist etch mask can prevent rough edges in the photoresist pattern from being transferred into a substrate and subsequently degrading the device performance. In this example, thickness H1 can be reduced from about 250 mm to about 150 nm which would still provide an H5 thickness of about 50 nm that is considered sufficient for line 58 to be a good etch mask.

The lower amount of LES is a benefit over prior art in that it allows a better management of device design. In other words, the overlap required for different features in adjacent layers is preserved and no defects such as open circuits are generated. A reduction in LES permits more freedom in mask design so that line extensions which require valuable space do not have to be added to line ends. Returning to FIG. 4c, photoresist 58b and ARC 57a can remain on the substrate for the next etch step or can be stripped by conventional methods following the trim process that forms hardmask 56a with linewidth L2. For example, a plasma ashing step to remove photoresist 58b and ARC 57a can be performed in the same chamber that is used to carry out the previous trim etch.

Figure 4D:
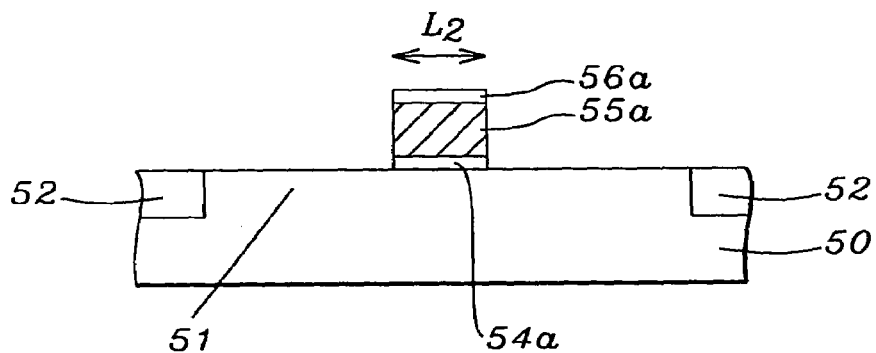

Referring to FIG. 4d, if photoresist 58b and ARC 57a are removed, then hardmask 56a serves as an etch mask for transferring the pattern through polysilicon layer 55 and through dielectric layer 54 to form gate electrode 55a and dielectric layer 54a. Any remaining photoresist 58b or ARC 57a is removed at this point. Hardmask 56a can remain on gate electrode 55a for further processing or can be removed by a suitable method known to those skilled in the art.

Additional MOSFET fabrication steps include forming spacers adjacent to the gate electrode, forming source/drain regions in the substrate, and forming silicide contacts. Details for completing the MOSFET are not given here since these steps are not key to this invention. A representative MOSFET structure is described in a prior art example shown in FIG. 1e.

Figure 6A:
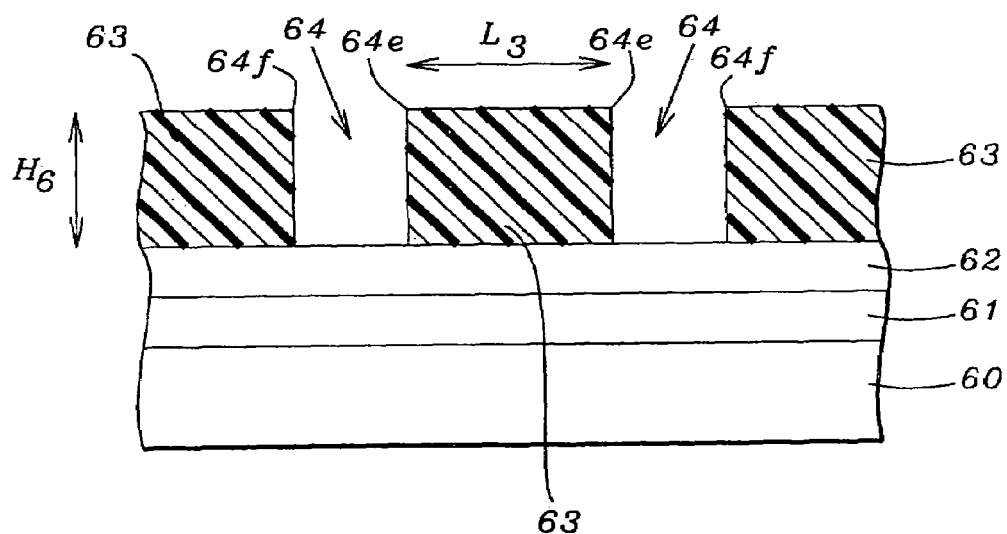
FIGS. 6a–6g show a method of forming shallow trench isolation features according to an embodiment of the present invention.

In a second embodiment, the method of the present invention is employed to form shallow trench isolation (STI) features in a substrate. Referring to FIG. 6a, a substrate 60 is provided which typically contains active and passive devices in a substructure (not shown). A silicon nitride layer 61 having a thickness of from 300 to 1000 Angstroms is deposited by a CVD method on the substrate 60. Then a hardmask 62 such as silicon oxynitride with a thickness between 200 and 800 Angstroms is deposited on the nitride layer 61. Optionally, an organic or inorganic ARC (not shown) is deposited on the hardmask to improve process latitude in a later photoresist patterning step.

A photoresist composition is then spin coated and patterned to form trench openings 64 and 65 that are separated by a photoresist layer 63 having a height H6 of between 1500 and 4000 Angstroms and a width L3. The photoresist composition is selected depending on the desired width L3 or on the width of trenches 64, 65, whichever is smaller. When L3 or the width of trenches 64, 65 is sub-130 nm, a 193 nm or sub-200 nm exposing wavelength is preferred in order to print L3 and trenches 64, 65 with a reasonable process latitude. For L3 or trench 64, 65 widths in the range of about 130 nm to about 300 nm, Deep UV radiation involving a 248 nm wavelength is generally preferred. Note that trench 64, 65 widths are shown as W4 in FIG. 6b.

Figure 6B:
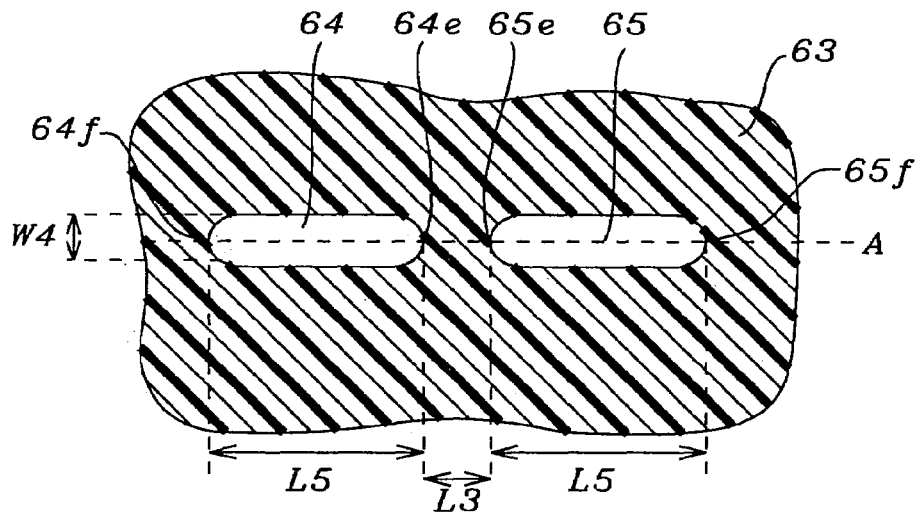
Figure 6C:
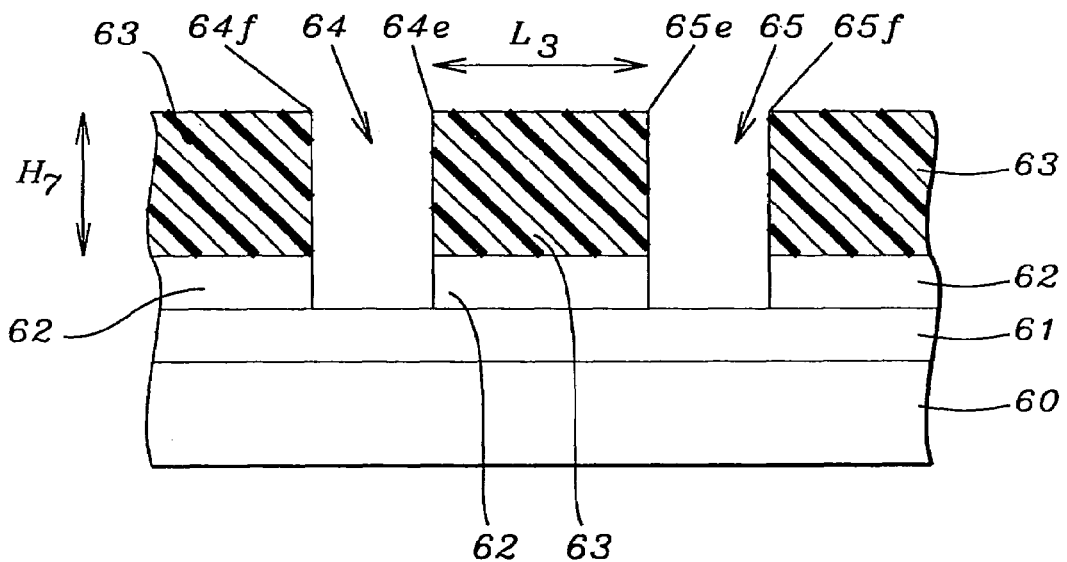

Referring to FIG. 6b, a top-down perspective depicts the line A where photoresist 63 and underlying layers 60, 61, 62 were cut to produce the cross-sectional view in FIG. 6a. Trenches 64, 65 are actually elongated holes with a length L5 and a width W4 and have adjacent ends 64e and 65e, respectively, separated by a distance L3. Referring to FIG. 6c, a key aspect of the present invention is that the pattern is first anisotropically transferred through hardmask 62 with a plasma etch. The etch is preferably performed with a $CF_4$ gas flow of 50 to 200 sccm, an argon flow of 50 to 300 sccm, a chamber pressure of about 5 to 20 mTorr, a chamber temperature of about 50° C. to 70° C. and a RF power of between about 200 and 600 Watts. The etch is usually stopped at a point indicated by an end point signal when monitoring the plasma gas mixture. In this process, trench openings 64 and 65 are transferred through hardmask 62. As a result, both hardmask 62 and photoresist 63 between the trenches 64, 65 have a width L3. Meanwhile, the thickness H6 of photoresist 63 in FIG. 6a is reduced slightly to H7.

Figure 6D:
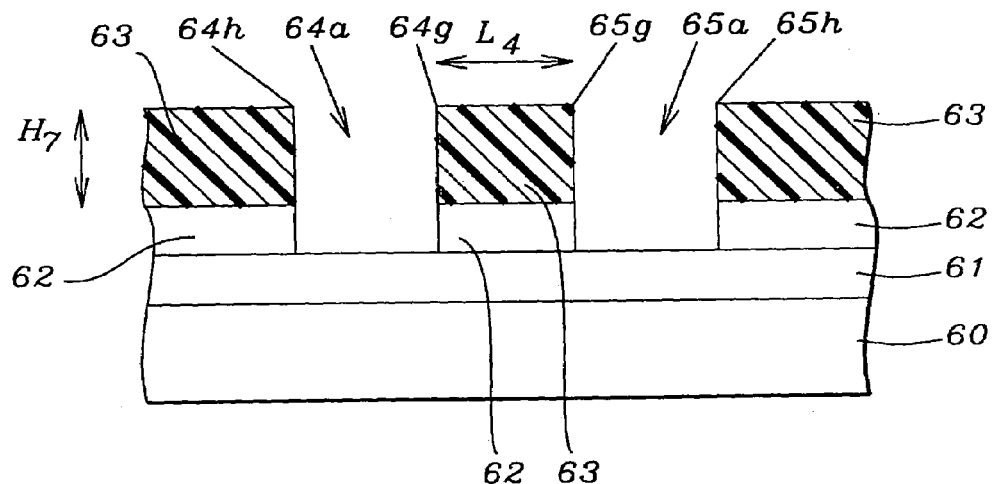

Referring to FIG. 6d, a second key aspect of this invention is that the distance L3 is reduced to L4 by an isotropic etch that trims hardmask layer 62 simultaneously while shrinking photoresist layer 63 between trenches 64, 65. A length (L3−L4/2) is removed from trench ends 64e, 65e and from trench ends 64f, 65f. The hardmask 62 trim etch is performed preferably with the following conditions: a 50 to 200 sccm flow rate of $C_XF_Y$ that is selected from a group including $CF_4$, $C_2F_6$, $C_3F_6$, $C_4F_6$, $C_4F_8$, and $C_5F_8$; a 50 to 200 sccm flow rate of $H_2$; a chamber pressure of about 5 to 20 mTorr; a chamber temperature of about 50° C. to 70° C.; and a RF power of between 300 and 1000 Watts. Optionally, oxygen with a flow rate of about 5 to 50 sccm is added to the gas mixture. The trim etch may be performed in the same chamber as the previous anisotropic etch.

Figure 6E:
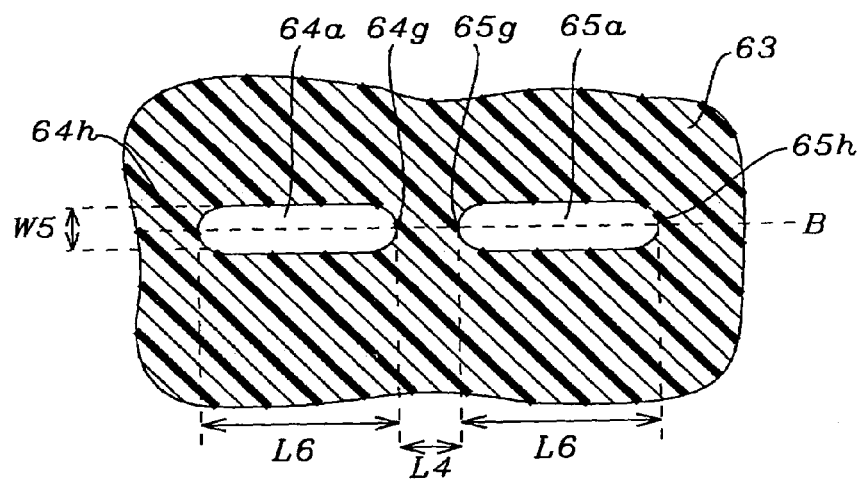

Referring to FIG. 6e, a top-down perspective shows the line B where photoresist 63 and underlying layers 60, 61, 62 were cut to produce the cross-sectional view in FIG. 6d. The trimming of photoresist 63 and hardmask 62 widens trenches 64, 65 of width W4 to produce trenches 64a, 65a of width W5. The amount of trench widening (W4−W5) is usually less than the amount of trench lengthening (L3−L4). The amount of trimming of photoresist 63 between trenches 64, 65 can be up to 20 nm per trench end or as much as a 40 nm total reduction from L3 to L4. However, this amount is considerably less than the reduction that occurs from conventional etch methods which usually reduce the distance between adjacent trenches by a significantly larger amount.

The height of photoresist 63 is decreased somewhat during the etch from H6 to H7 but the top loss is less than what is realized during conventional photoresist trimming methods. As discussed in the previous embodiment, a higher photoresist thickness retention allows one to decrease the original film thickness for photoresist 63 and thereby improve the process latitude for the patterning process. A thicker photoresist layer 63 also reduces the likelihood that rough edges at the top of trench openings 64, 65 and 64a, 65a will be transferred into underlying layers where rough edges on the pattern can detract from the resulting device performance.

Figure 6F:
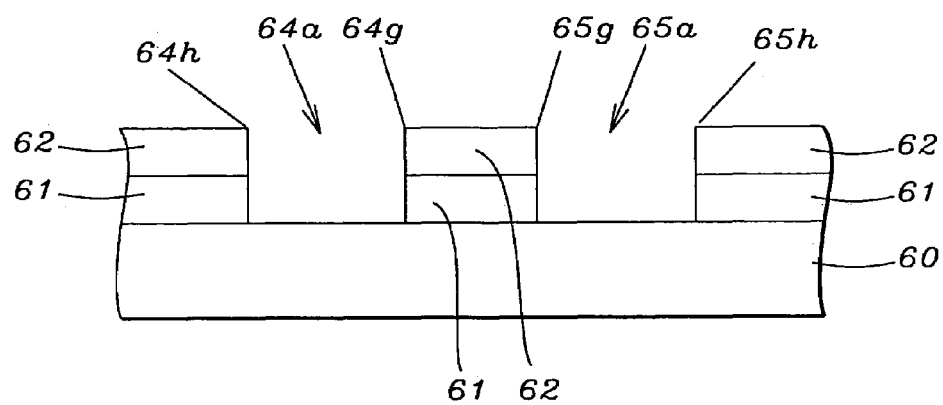
Figure 6G:
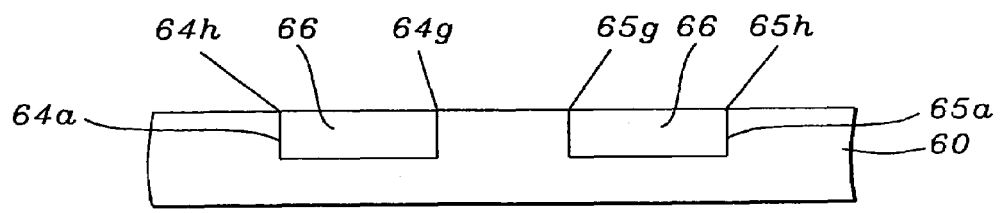

Referring to FIG. 6f, photoresist layer 63 is removed by a conventional method such as a plasma ashing that can be performed in the same chamber as the previous trimming step. Hardmask layer 62 then serves as an etch mask for transfer of the pattern through the silicon nitride layer 61 and into substrate 60. The method for the etch transfer is well known to those skilled in the art and is not included here. In FIG. 6g, hardmask layer 62 is removed and a dielectric material 66 such as $SiO_2$ is deposited by a CVD method to fill trenches 64a and 65a. The dielectric material is planarized by a technique such as chemical mechanical polishing. Finally, nitride layer 61 is removed by a wet strip to complete the STI structure. The space between STI features 64a and 65a which is L4 defines the active area upon which a gate electrode can be constructed to form a MOSFET.

The method can be readily implemented in manufacturing since it makes use of existing etch tools and etch gases. The required photoresist, hardmask, and ARC are also employed for other processes.

While this invention has been particularly shown and described with reference to, the preferred embodiments thereof, it will be understood by those skilled in the art that various changes in form and details may be made without departing from the spirit and scope of this invention.

We claim:

1. A method of forming shallow trenches in a substrate comprising:
   (a) providing a substrate;
   (b) forming a layer stack comprising a top photosensitive layer, a middle hardmask layer and a bottom silicon nitride layer on said substrate;
   (c) patterning said photosensitive layer to form trenches;
   (d) transferring said pattern through said hardmask;
   (e) trimming said hardmask and said photosensitive layer; and
   (f) transferring said pattern through the silicon nitride layer and into the substrate with a plasma etch.

2. The method of claim 1 wherein said hard mask is comprised of silicon oxynitride.

3. The method of claim 1 further comprising an ARC between the photoresist and hardmask layers.

4. The method of claim 3 wherein the ARC is an organic or inorganic material having a thickness of about 300 to 1000 Angstroms.

5. The method of claim 1 wherein said photoresist has a thickness between about 1500 and 4000 Angstroms.

6. The method of claim 1 wherein the minimum distance between adjacent trenches is less than 300 nm.

7. The method of claim 1 wherein said hardmask etch is preferably performed with conditions comprising a $CF_4$ flow rate of 50 to 200 sccm, an argon flow rate of 5 to 300 seem, a chamber pressure of about 5 to 20 mTorr, a chamber temperature of about 50° C. to 70° C. and a RF power of between 200 and 600 Watts.

8. The method of claim 1 wherein said hardmask trim etch is performed with conditions comprising a $C_XF_Y$ gas flow rate of about 50 to 200 sccm, a $H_2$ flow rate of about 5 to 200 sccm, a chamber pressure of about 5 to 20 mTorr, a chamber temperature of about 50° C. to 70° C., and a RF power between about 300 and 1000 Watts.

9. The method of claim 8 further comprising an oxygen flow rate of about 5 to 50 sccm.

10. The method of claim 8 wherein said $C_XF_Y$ gas is selected from a group including $CF_4$, $C_3F_6$, $C_4F_6$, $C_4F_8$, and $C_5F_8$.

11. The method of claim 3 wherein said photoresist and ARC are removed before the substrate etch.

12. The method of claim 1 wherein the amount of trimming between said trenches ranges from 0 to about 20 run per trench end for a total trench lengthening of 0 to about 40 nm.

13. The method of claim 1 wherein a majority of the photosensitive layer thickness is retained after said hardmask etch and hardmask trim steps.

14. The method of claim 1 wherein said hardmask etch and hardmask trim are performed in the same etch chamber.

15. The method of claim 1 further comprising removing said photosensitive layer, hardmask and nitride layers and filling said trenches with a dielectric material to form STI features in said substrate.

* * * * *